United States Patent
Jamneala et al.

(10) Patent No.: US 8,508,315 B2
(45) Date of Patent: Aug. 13, 2013

(54) ACOUSTICALLY COUPLED RESONATOR FILTER WITH IMPEDANCE TRANSFORMATION RATIO CONTROLLED BY RESONANT FREQUENCY DIFFERENCE BETWEEN TWO COUPLED RESONATORS

(75) Inventors: Tiberiu Jamneala, San Francisco, CA (US); Alexandre Shirakawa, San Jose, CA (US); Bernhard Koelle, Milpitas, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 620 days.

(21) Appl. No.: 12/710,626

(22) Filed: Feb. 23, 2010

(65) Prior Publication Data
US 2011/0204995 A1 Aug. 25, 2011

(51) Int. Cl.
*H03H 9/54* (2006.01)
(52) U.S. Cl.
USPC ............... 333/189; 333/133; 310/334
(58) Field of Classification Search
USPC ............ 333/133, 189, 187; 310/321–323, 310/334; 29/25.35, 594
See application file for complete search history.

(56) References Cited

U.S. PATENT DOCUMENTS

| | | | |
|---|---|---|---|
| 5,587,620 A | 12/1996 | Ruby et al. | |
| 5,873,153 A | 2/1999 | Ruby et al. | |
| 6,107,721 A | 8/2000 | Lakin | |
| 6,507,983 B1 | 1/2003 | Ruby et al. | |
| 7,075,214 B2* | 7/2006 | Inoue et al. | 310/328 |
| 7,280,007 B2 | 10/2007 | Feng et al. | |
| 7,310,861 B2* | 12/2007 | Aigner et al. | 29/25.35 |
| 7,388,454 B2 | 6/2008 | Ruby et al. | |
| 7,598,827 B2 | 10/2009 | Stuebing et al. | |
| 7,629,865 B2 | 12/2009 | Ruby | |
| 2005/0128030 A1* | 6/2005 | Larson et al. | 333/191 |
| 2005/0206476 A1* | 9/2005 | Ella et al. | 333/133 |
| 2006/0220763 A1* | 10/2006 | Iwasaki et al. | 333/133 |
| 2007/0176710 A1* | 8/2007 | Jamneala et al. | 333/191 |
| 2007/0205849 A1 | 9/2007 | Otis | |
| 2007/0205850 A1 | 9/2007 | Jamneala et al. | |
| 2008/0309432 A1* | 12/2008 | Fattinger et al. | 333/189 |
| 2009/0079514 A1 | 3/2009 | Jamneala et al. | |
| 2009/0096549 A1* | 4/2009 | Thalhammer et al. | 333/189 |
| 2009/0096550 A1 | 4/2009 | Handtmann et al. | |
| 2009/0273415 A1 | 11/2009 | Frank et al. | |
| 2012/0004016 A1* | 1/2012 | Carpentier et al. | 455/575.7 |

OTHER PUBLICATIONS

K.M. Lakin; "Bulk Acoustic Wave Coupled Resonator Filters"; 2002 IEEE International Frequency Control Syposium and PDA Exhibition; 2002, pp. 8-14.*

* cited by examiner

*Primary Examiner* — Barbara Summons

(57) ABSTRACT

A signal processing device includes a first acoustic resonator, a second acoustic resonator disposed on the first acoustic resonator, and a coupling layer between the first and the second acoustic resonators. The first acoustic resonator has a first electrical impedance and a first resonance frequency and includes a first set of electrodes, and a first piezoelectric layer having a first thickness, disposed between the first set of electrodes. The second acoustic resonator has a second electrical impedance and a second resonance frequency, and includes a second set of electrodes, and a second piezoelectric layer having a second thickness, wherein the second piezoelectric layer is disposed between the second set of electrodes. The first electrical impedance at a passband frequency of the device substantially differs from the second electrical impedance at the passband frequency of the device. The first and second resonance frequencies are substantially different from each other.

13 Claims, 5 Drawing Sheets

ACOUSTICALLY COUPLED RESONATOR FILTER WITH IMPEDANCE TRANSFORMATION RATIO CONTROLLED BY RESONANT FREQUENCY DIFFERENCE BETWEEN TWO COUPLED RESONATORS

BACKGROUND

Frequency selective filters are ubiquitous in communication devices, such as mobile telephones, wireless Internet devices, etc. Among other technologies, bulk acoustic wave (BAW) devices, surface acoustic wave (SAW) devices, thin film bulk acoustic resonator (FBAR) devices and coupled resonator filters (CRF) may be employed as filters in appropriate devices.

FBARs are similar in principle to bulk acoustic resonators such as quartz, but are scaled down to resonate at GHz frequencies. A typical implementation of an acoustic resonator comprises a layer of piezoelectric material arranged between two metal electrodes. Common piezoelectric materials include, for example, aluminum nitride (AlN) and zinc oxide (ZnO).

FIG. 1 shows an exemplary resonator 10 which comprises a layer of piezoelectric material, which will be referred to as piezo layer 12 below, and is located between a first electrode, or top electrode T, and a second electrode, or bottom electrode B. The designations top electrode and bottom electrode are just for explanation purposes and do not represent any limitation with regard to the spatial arrangement and positioning of the acoustic resonator.

If an electric field is applied between first electrode T and second electrode B of acoustic resonator 10, the reciprocal or inverse piezoelectric effect will cause acoustic resonator 10 to mechanically expand or contract, the case of expansion or of contraction depending on the polarization of the piezoelectric material. This means that the opposite case applies if the electric field is inversely applied between the T and B electrodes. In the case of an alternating field, an acoustic wave is generated in piezo layer 12, and, depending on the implementation of acoustic resonator 10, this wave will propagate, for example, in parallel with the electric field, as a longitudinal wave, or, as a transversal wave, transverse to the electric field, and will be reflected, for example, at the acoustic interface of the resonator with the outside world. For longitudinal waves, whenever the thickness d of piezo layer 12 and of the top and bottom electrodes can accommodate an integer multiple of half the wavelength λ of the acoustic waves, resonance states and/or acoustic resonance vibrations will occur. Because each acoustic material has a different propagation velocity for the acoustic wave, the fundamental resonance frequency, i.e. the lowest resonance frequency $F_{RES}$, will be inversely proportional to the weighted sum of all thicknesses of the resonator layers.

The piezoelectric properties and, thus, also the resonance properties of an acoustic resonator depend on various factors, e.g. on the piezoelectric material, the fabrication method, the polarization impressed upon the piezoelectric material during fabrication, and the quality of the piezo material (i.e. the size of the crystals). As has been mentioned above, the resonance frequency in particular depends on the total thickness of the resonator.

FIG. 2 shows a model of a bulk acoustic wave (BAW) device or thin film bulk acoustic resonator (FBAR). The model of FIG. 2 is a modified Butterworth-Van Dyke model (MBVD) model. For a high quality resonator, the resistance values Rs, Ro, and Rm are small, in which case they can be neglected at the frequencies of interest. In that case, for simplification, the device can be modeled by the series-resonant combination of Lm and Cm, in parallel with a capacitance Co. The frequency response of this model is a bandpass response, with frequencies below the passband being attenuated mainly by the capacitors Cm and Co, and with frequencies above the passband being attenuated mainly by the inductance Lm.

As noted above, acoustic resonators can be employed in electrical filters, and in particular in radio frequency (RF) and microwave filters. These resonators can be combined in various ways to produce a variety of filter configurations. One particular configuration is a coupled resonator filter (CRF) wherein a coupling layer combines the acoustic action of the two acoustic resonators, which leads to a bandpass filter transfer function. A typical device includes two acoustic stacks, each comprising a layer of piezoelectric material disposed between two electrodes. A decoupling material is disposed between the acoustic stacks. Acoustic waves achieve resonance across the acoustic stacks, with the resonant frequency of the waves being determined by the materials in the acoustic stack.

FIG. 3 shows a device 300 including two acoustically coupled acoustic resonators 310, 320 having an acoustic coupling layer 330 between them.

Device 300 may operate as a bandpass filter, receiving an input signal applied to the input terminal 305 connected to the first acoustic resonator 310, and providing a bandpass-filtered output signal at output terminal 355.

Device 300 may be employed, for example, as a bandpass filter in a cellular or mobile telephone.

In many applications, it is useful for a filter such as device 300 also to provide an electrical impedance transformation from an input having one electrical impedance to an output having another electrical impedance. For example, in many communication devices, an antenna is used to receive signal and to transmit signals. The received signals are provided to a receiving amplifier of a receiver of the communication device. Moreover, the antenna may receive signals from a transmitter amplifier of a transmitter. Regardless of whether the transmission/reception of signals is half or full duplex, or even simplex, often times the antenna has an impedance that varies from the impedance of the amplifier (receiver or transmitter). As should be appreciated, mismatched impedances result in reflections and losses that are beneficially avoided.

Coupled resonator filters with which provide an impedance transformation have been previously disclosed. For example, one such solution involves using different piezoelectric thicknesses for the two resonators and/or using electrodes with different metals. However, in practice these approaches can have drawbacks, including in some cases low effective coupling constant for one of the two resonators (with negative implications on the filter insertion loss), and manufacturing difficulty in using different materials and/or trying to tightly control the piezoelectric materials' thicknesses in order to control the impedance transformation ratio to be at a desired value.

What is needed, therefore, is an acoustic resonator filter structure that can overcome at least some of the shortcomings of known electrical impedance transformers discussed above.

SUMMARY

In an example embodiment, a coupled resonator filter comprises: a first film bulk acoustic resonator (FBAR); a second FBAR disposed over the first FBAR; and a coupling layer disposed between the first and the second FBARs. The first FBAR has a first electrical impedance and a first resonance frequency. The first FBAR comprises: a first electrode, a first piezoelectric layer having a first thickness, disposed on the first electrode, and a second electrode disposed on the first piezoelectric layer. The second FBAR has a second electrical impedance and a second resonance frequency. The second FBAR comprises: a third electrode, a second piezoelectric layer having a second thickness, disposed on the third electrode, and a fourth electrode disposed on the second piezoelectric layer. The first thickness of the first piezoelectric layer is substantially the same as the second thickness of the second piezoelectric layer. The first and second resonance frequencies are substantially different from each other. The thickness of the fourth electrode is substantially different than the thickness of at least one of the first, second, and third electrodes.

In another example embodiment, a signal processing device includes a first acoustic resonator, a second acoustic resonator disposed on the first acoustic resonator, and a coupling layer between the first and the second acoustic resonators. The first acoustic resonator has a first electrical impedance and a first resonance frequency and includes a first set of electrodes, and a first piezoelectric layer having a first thickness, disposed between the first set of electrodes. The second acoustic resonator has a second electrical impedance and a second resonance frequency, and includes a second set of electrodes, and a second piezoelectric layer having a second thickness, wherein the second piezoelectric layer is disposed between the second set of electrodes. The first electrical impedance at a passband frequency of the device substantially differs from the second electrical impedance at the passband frequency of the device. The first and second resonance frequencies are substantially different from each other.

In yet another example embodiment, a method is provided for making a signal processing device. The method comprises: forming a first acoustic resonator; forming a coupling layer on the first acoustic resonator; and forming on the coupling layer a second acoustic resonator. The first acoustic resonator is formed to have a first electrical impedance and a first resonance frequency. The first acoustic resonator includes a first set of electrodes, and a first piezoelectric layer having a first thickness, disposed between the first set of electrodes. The second acoustic resonator is formed to have a second electrical impedance and a second resonance frequency. The second acoustic resonator comprises: a second set of electrodes, and a second piezoelectric layer having a second thickness, wherein the second piezoelectric layer is disposed between the second set of electrodes. The first electrical impedance at a passband frequency of the device differs from the second electrical impedance at the passband frequency of the device. The first and second resonance frequencies are substantially different from each other.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

In the following detailed description, for purposes of explanation and not limitation, example embodiments disclosing specific details are set forth in order to provide a thorough understanding of an embodiment according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparati and methods may be omitted so as to not obscure the description of the example embodiments. Such methods and apparati are clearly within the scope of the present teachings.

Figure 4:
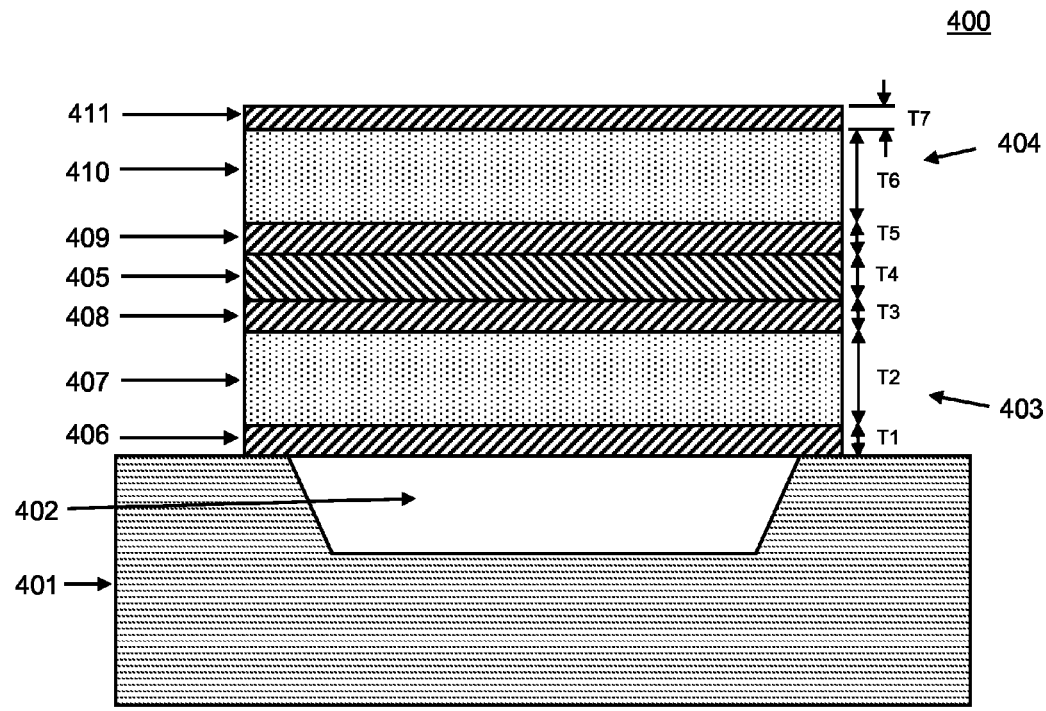
FIG. 4 shows one embodiment of a signal processing device comprising a coupled acoustic resonator filter which provides an electrical impedance transformation.

FIG. 4 shows one embodiment of a signal processing device ("device") 400 comprising a coupled acoustic resonator filter which provides an electrical impedance transformation. Device 400 comprises a substrate 401 having a cavity 402 (or acoustic mirror) therein. A first film bulk acoustic resonator (FBAR) stack 403 is disposed over the cavity 402 of the substrate 401 resulting in an FBAR membrane. Device 400 comprises a second FBAR stack 404 disposed over the first FBAR stack 403. An acoustic coupling layer 405 is disposed between first and second FBAR stacks 403 and 404 as shown. In representative embodiments, acoustic coupling layer 405 comprises dielectric polymer SiLK® commercially provided by E.I. Dupont, Inc., USA., or Carbon Doped Oxides (CDO) with tunable acoustic impedance. In other embodiments, acoustic coupling layer 405 is formed of a stack of layers alternately formed of high and low acoustic impedance materials and having respective thicknesses of approximately one-quarter of the wavelength corresponding to the target resonant frequency of the balun. It is emphasized that other materials and arrangements for acoustic coupling layer 405 are contemplated.

Cavity or reflector (e.g., a mismatched acoustic Bragg reflector) 402 and its fabrication may be as described in commonly owned U.S. Pat. No. 6,107,721, to Lakin, the disclosure of which is specifically incorporated into this disclosure by reference in its entirety. Moreover, cavity 402 may be fabricated according to known semiconductor processing methods and using known materials. Illustratively, cavity 402 may be fabricated according to the teachings of U.S. Pat. Nos. 5,587,620, 5,873,153 and 6,507,983 to Ruby, et al. The disclosures of these patents are specifically incorporated herein by reference. It is emphasized that the methods described in these patents are representative and other methods of fabrication and materials within the purview of one of ordinary skill in the art are contemplated.

First FBAR 403 comprises a first set of electrodes 406 and 408, and a first piezoelectric layer 407 therebetween. In a representative embodiment, first piezoelectric layer 407 comprises aluminum nitride (AlN) although other materials within the purview of one of ordinary skill in the art may be used in place of or in addition to AlN.

Second FBAR stack 404 comprises a second set of electrodes 409 and 411, and a second piezoelectric layer 410 therebetween. In a representative embodiment, second piezoelectric layer 410 comprises aluminum nitride (AlN) although other materials within the purview of one of ordinary skill in the art may be used in place of or in addition to AlN.

In a beneficial arrangement, in device 400 first and second FBAR stacks 403 and 404 have different electrical impedances than each other in a passband of device 400, and consequently device 400 may provide an impedance transformation between its input and output.

The electrical impedance of an FBAR is determined by a variety of factors, including its area, the thickness of the peizo layer and the other thicknesses and materials used in its various layers.

Beneficially, device 400 has a stacked vertical configuration such that there is a complete overlap between second FBAR 404 and first FBAR 403. In that case, the areas of FBAR stacks 403 and 404 are substantially the same as each other.

In a beneficial arrangement, in device 400, first and second FBAR stacks 403 and 404 are made to have substantially different resonant frequencies than each other so as to provide different electrical impedances within the passband of device 400. This will now be explained with respect to FIGS. 5 and 6.

Figure 5:
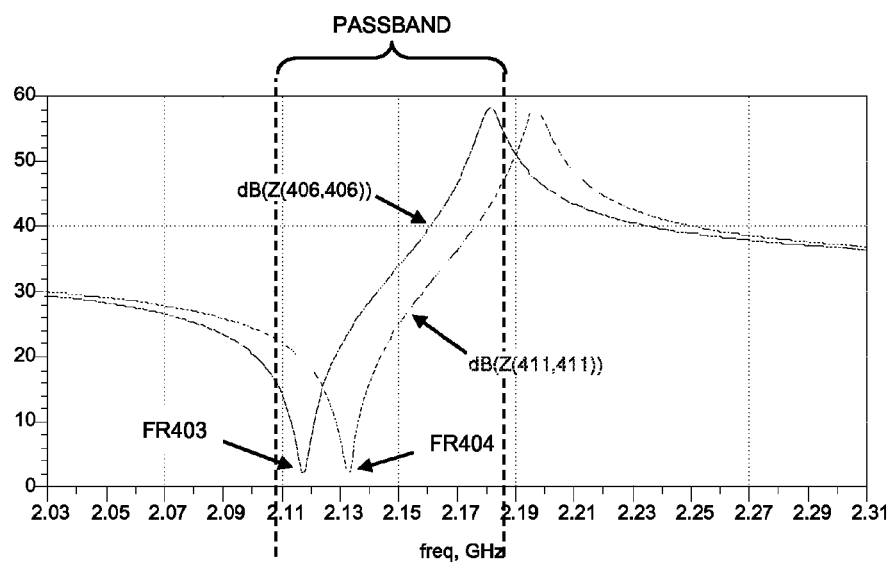
FIG. 5 plots individual input impedances as a function of frequency for each of two coupled resonators in one example embodiment of a coupled acoustic resonator filter which provides an impedance transformation.

FIG. 5 plots individual input impedances as a function of frequency for each of two coupled resonators in one example embodiment of a coupled acoustic resonator filter which provides an impedance transformation. The example illustrated in FIG. 5 will now be explained with respect to an example of the embodiment shown in FIG. 4. FIG. 5 plots the individual electrical impedances, as a function of frequency, of each of the first and second FBAR stacks 403 and 404. More specifically, FIG. 5 shows two responses: a first response db(Z(406, 406) which represents the impedance seen at first electrode 406 for FBAR 403 alone with electrode 408 grounded, and a second response db(Z(411, 411) which represents the impedance seen at fourth electrode 411 for FBAR 404 alone with electrode 409 grounded.

In this example, the resonance frequency FR404 of the top (second) FBAR 404 is seen to be substantially higher than the resonance frequency FR403 of the bottom (first) FBAR 403. As a result, it is seen that within the passband of device 400, the electrical impedance of the top (second) FBAR 404 is seen to be substantially less than electrical impedance of the bottom (first) FBAR 403. Thus, example embodiments of device 400 are capable of providing an impedance transformation between a device connected to an electrode (or electrodes) of FBAR 404 and another device connected to an electrode (or electrodes) of FBAR 403.

Figure 1:
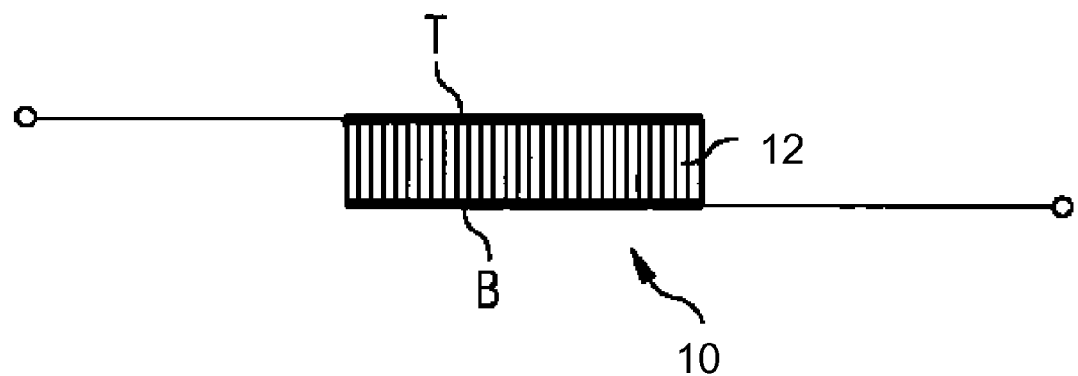
FIG. 1 shows an exemplary acoustic resonator.
Figure 2:
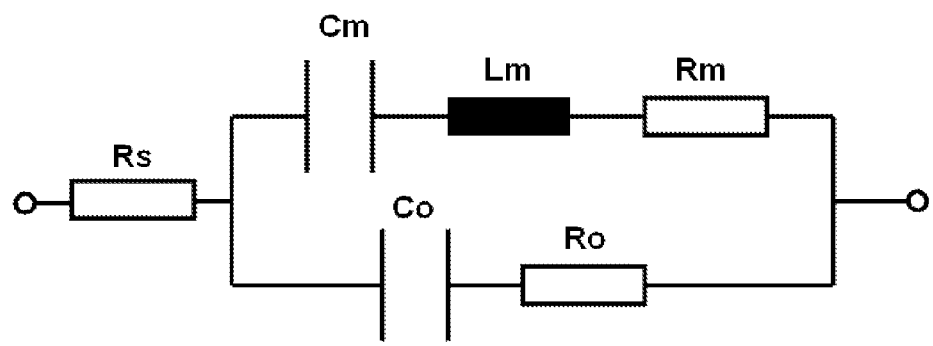
FIG. 2 shows an electrical model of a bulk acoustic wave (BAW) or thin film bulk acoustic resonator (FBAR).
Figure 3:
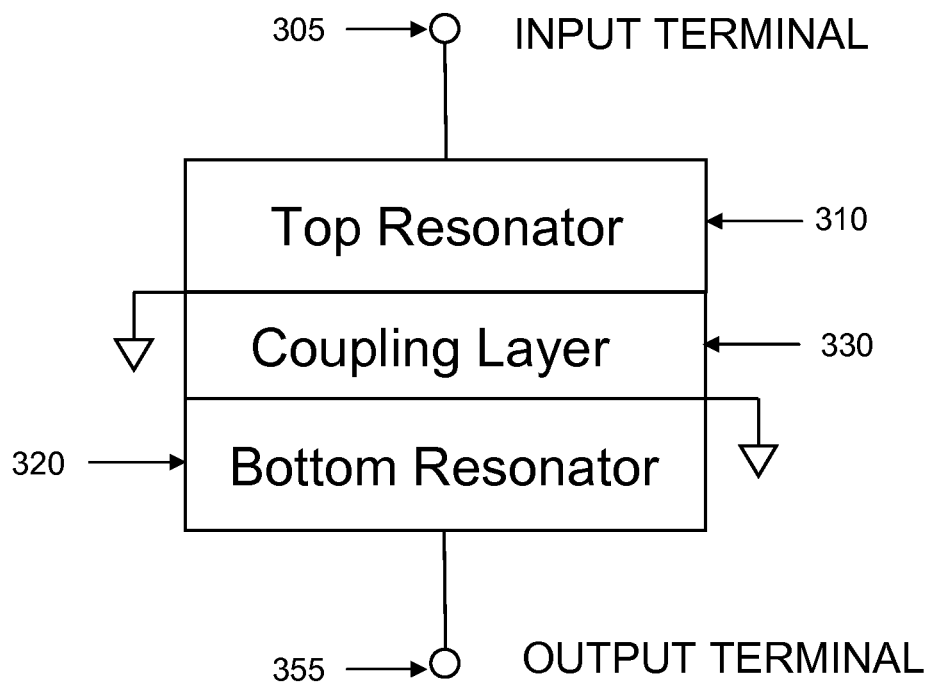
FIG. 3 shows two acoustically coupled acoustic resonators.
Figure 6:
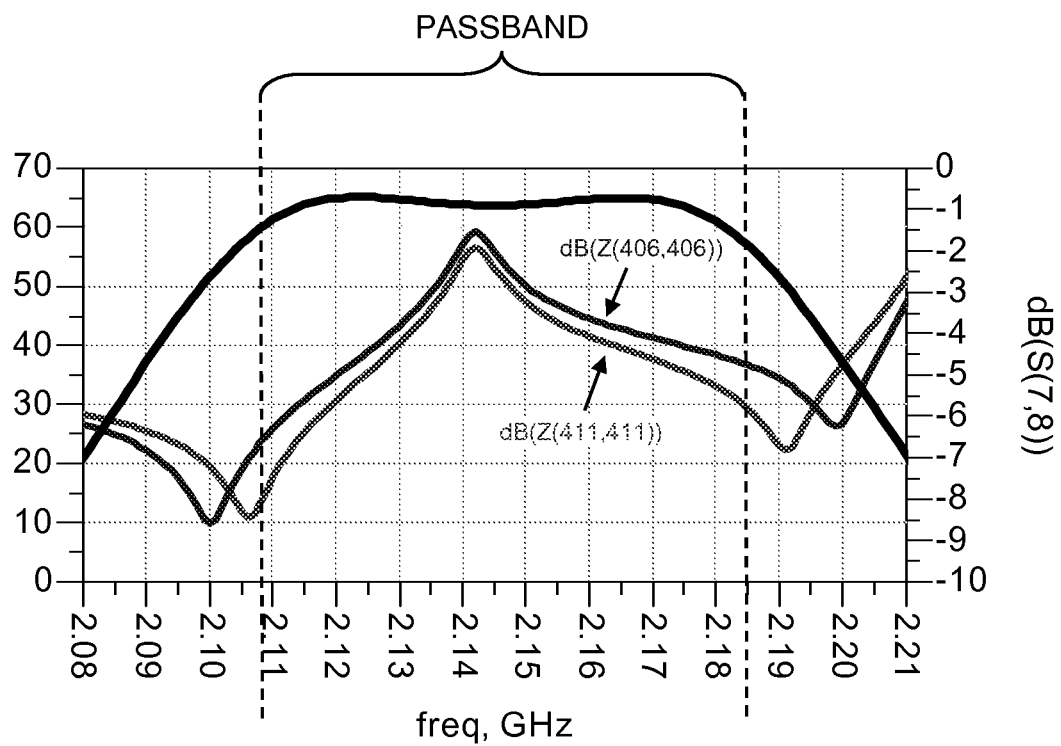
FIG. 6 plots input and output impedances and the passband filter response as a function of frequency for one embodiment of a coupled acoustic resonator filter which provides an impedance transformation.

FIG. 6 plots input and output impedances and the passband filter response as a function of frequency for one embodiment of a coupled acoustic resonator filter which provides such an impedance transformation. FIG. 6 plots the input impedance db(Z(406, 406) of an example embodiment of device 400 as seen at first electrode 406 (with electrode 408 grounded), and the input impedance db(Z(411, 411) as seen at fourth electrode 411 (with electrode 409 rounded). FIG. 6 also plots the filter response of device 400 from a first terminal connected to fourth electrode 411, to a second terminal connected to first electrode 406, with electrodes 408 and 409 grounded (see FIG. 3 for comparison).

By stating that the resonant frequencies FR403 and FR404 for FBAR stacks 403 and 404 are made to be substantially different than each other, we mean that the resonant frequencies FR403 and FR404 are different than each other by an amount that is greater than that which might be produced naturally by manufacturing tolerances if one attempted to make the resonant frequencies of FBAR 403 and FBAR 404 to be the same. However, in a given embodiment the ratio of the two resonant frequencies FR404/FR403 might still be very close to unity. For illustration, in the example illustrated in FIGS. 5 and 6 the difference between FR404 and FR403 is only about 15 MHz at about 2 GHz, and the passband of device 400 is about 70-80 MHz. So the ratio FR404/FR403 is about 99.3%. Of course these are only illustrative numbers and not limiting of the actual ranges of resonant frequency differences that might be present in any particular embodiment of device 400.

Turning back to FIG. 4, the resonant frequency FR of an FBAR is determined by a variety of factors, including the thicknesses and materials used in its various layers. As shown in FIG. 4, each of the various layers of first and second FBAR stacks 403 and 404 and acoustic coupling layer 405 has a corresponding thickness. For example, first electrode 406 has a thickness T1, first piezoelectric layer 407 has a thickness T2, second electrode 408 has a thickness T3, acoustic coupling layer 405 has a thickness T4, layer 409 has a thickness T5, second piezoelectric layer 410 has a thickness T6, and fourth electrode 411 has a thickness T7.

In a beneficial arrangement, the thicknesses T2 and 14 and materials for first and second piezoelectric layers 407 and 410 are made to be substantially the same as each other.

In a beneficial arrangement, the resonant frequencies FR403 and FR404 of first and second FBAR stacks 403 and 404 respectively are made to be substantially different than each other by making the thickness of one or both electrodes of FBAR 403 to be different than the thickness(es) of one or both electrodes of FBAR 404. As discussed above with respect to FIGS. 5 and 6, the resulting difference between resonant frequencies FR403 and FR404 for FBAR stacks—403 and 404 respectively will in turn produce a difference in the electrical impedances of the two FBAR stacks 403 and 404 within the passband of device 400, thus providing a desired impedance transformation for device 400.

In a beneficial arrangement, the thickness T7 of the fourth electrode 411 of FBAR 404 is made to be different than at least one of the thicknesses T1, T3 and T5 of the electrodes 406, 408 and 409, respectively. In a particularly beneficial arrangement, the thickness T7 of the fourth electrode 411 is made to be different than the thickness T3 of the second electrode 408 of FBAR 403. Beneficially, since the electrode layer for fourth electrode 411 is formed after all other layers beneath it have been formed, the thickness of this electrode layer may be adjusted (e.g., by etch, by vaporization, by chemical mechanical polishing, or any other convenient means) until the desired difference between the resonant frequencies FR403 and FR404 of FBAR 403 and FBAR 404 respectively is achieved. In one beneficial arrangement, during manufacturing, one or more electrical parameters of device 400 may be measured while the thickness T7 of fourth electrode 411 is adjusted until the desired resonant frequency FR404 is obtained for FBAR 404. Additionally, it is possible that during manufacturing, and before FBAR 404 is fabricated, that one or more electrical parameters of FBAR 403 may be measured while the thickness T3 of electrode 408 is adjusted until the desired resonant frequency FR403 is obtained for FBAR 403.

In a beneficial arrangement, the thickness T7 of fourth electrode 411 may be made to be less than the thickness T3 of electrode 408 so as to make the resonant frequency FR404 of FBAR 404 to be higher than the resonant frequency FR403 of FBAR 403. However it is also possible that in some embodiments the thickness T7 of fourth electrode 411 will be made thicker than the thickness 13 of electrode 408. Various combinations of thicknesses T1, T3, T5 and T7 may be utilized to achieve the desired resonant frequencies FR403 and FR404 for FBAR stacks and 404, respectively.

In a representative embodiment, the first set of electrodes 406, 408 are made of or comprise tungsten (W) or an alloy thereof, or molybdenum (Mo) or an alloy thereof.

The electrodes 411, 409, 408 and 406 may be selectively apodized and may include mass loading layers and other performance enhancing features. The use of apodization and mass loading are known to those of ordinary skill in the art and details thereof are generally omitted in order to avoid obscuring the description of the representative embodiments. For example, details of apodization may be found in U.S. patent application Ser. No. 11/443,954, entitled "Piezoelectric Resonator Structures and Electrical Filters" to Richard C. Ruby, et al. In addition, details of mass loading may be found in U.S. patent application Ser. No. 10/990,201, entitled "Thin Film Bulk Acoustic Resonator with Mass Loaded Perimeter" to Hongjun Feng, et al.; and U.S. patent application Ser. No. 11/713,726, entitled "Piezoelectric Resonator Structures and Electrical Filters having Frame Elements" to Jamneala, et al. Furthermore, the FBAR stacks 403, 404 may include frame structures such as described in U.S. patent application Ser. No. 11/159,753, entitled "Acoustic Resonator Performance Enhancement Using Alternating Frame Structure" to Richard C. Ruby, et al.

As should be appreciated, first and second FBAR stacks 403 and 404 comprise a coupled resonator structure. As such, only the area of overlap functions as coupled acoustic resonators. Therefore, the shapes and dimensions of electrodes 411, 409, 408 and 406, and intervening first and second piezoelectric layers 407 and 410, are selected to be substantially the same (i.e., to within manufacturing tolerances). Moreover, the electrodes and piezoelectric layers are aligned to substantially overlap (again to within manufacturing tolerances), thereby substantially optimizing the overlap of the FBAR stacks 403 & 404.

The area of first and second FBAR stacks 403 & 404 is determined by the area of the electrodes 411, 409, 408 and 406, and intervening first and second piezoelectric layers 407 and 410. Moreover, the absolute impedances of the first and second FBAR stacks 403 and 404 are determined in part by the areal dimensions of the first and second FBAR stacks 403 and 404. Thus, the areal dimensions of the electrodes 411, 409, 408 and 406, and intervening first and second piezoelectric layers 407, 410, are used to select the absolute impedances of the first and second FBAR stacks 403 and 404.

In practice, once the thicknesses T1, T3, T5 and T7 of electrodes 411, 409, 408 and 406 are determined for the desired resonant frequencies of first and second FBAR stacks 403 and 404, the layers of the stacked FBAR structure are formed by known processing methods, such as described in one or more of the incorporated references above. To provide the absolute impedance of the first FBAR 403 and of the second FBAR 404, the electrodes 411, 409, 408 and 406 and first and second piezoelectric layers 407, 410 are fabricated with the required areal dimensions to achieve the desired impedance.

In an example embodiment, the electrodes 411, 409, 408 and 406, and first and second piezoelectric layers 407, 410, are sized to provide the desired absolute impedance for first FBAR 403 (e.g., 75Ω), and then the resonant frequency FR404 of second FBAR 404 is adjusted with respect to resonant frequency FR403 of first FBAR 403 to provide a desired impedance ratio (e.g., 2:3) between second FBAR 404 and first FBAR 403. In that case, for example, device 400 may provide an impedance transformation from 75Ω to 50Ω or vice versa.

Figure 7:
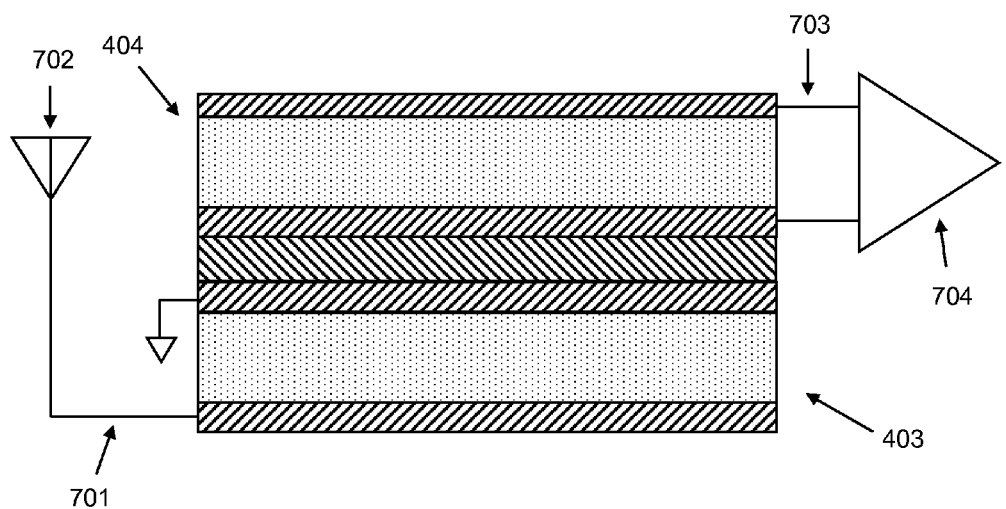
FIG. 7 shows a simplified schematic view of a portion of one embodiment of a signal processing device comprising a first communication device including a coupled acoustic resonator filter which provides an electrical impedance transformation.

FIG. 7 shows a simplified schematic view of a portion of one embodiment of a signal processing device ("device") 700 comprising a first communication device including a coupled acoustic resonator filter which provides an electrical impedance transformation. By "portion" is meant only the elements germane to the present discussion are shown. Naturally, a communication device (e.g., a mobile phone) includes a large number of components, which while necessary to its function, need not be described in order to properly describe the function of device 400 within device 700. Thus, these components are not described to avoid obscuring the description of the illustrative embodiments.

Device 700 includes device 400 including the first and second FBAR stacks 403 and 404. Substrate 401 is not illustrated for simplicity. Notably, many details of device 400 described in conjunction with FIG. 4 are common to the device 700 and are not repeated. An input 701 is connected to an antenna 702. The input 701 is connected to first FBAR 403 having a first resonant frequency and a corresponding first electrical impedance in the passband of device 400. An electrical signal from the input 701 is converted to an acoustic signal and is coupled to second FBAR 404 having a second resonant frequency and a corresponding second electrical impedance in the passband of device 400. Second FBAR 404 converts the acoustic signal to an electrical signal and provides the electrical signal to an output 703. In the representative embodiment, the output is connected to a receiver amplifier 704, which amplifies the signal for further processing at a receiver (not shown in FIG. 7.). In one beneficial embodiment, the thicknesses and areal dimensions of the various layers of FBAR stacks 403 and 404 are selected such that a signal from a 75Ω input 701 is provided to a 50Ω output 703 by device 400 with an appropriate impedance transformation by device 400 to match the output impedance of antenna 702 on the one hand, and to match the input impedance of receiver amplifier 704 on the other hand.

Figure 8:
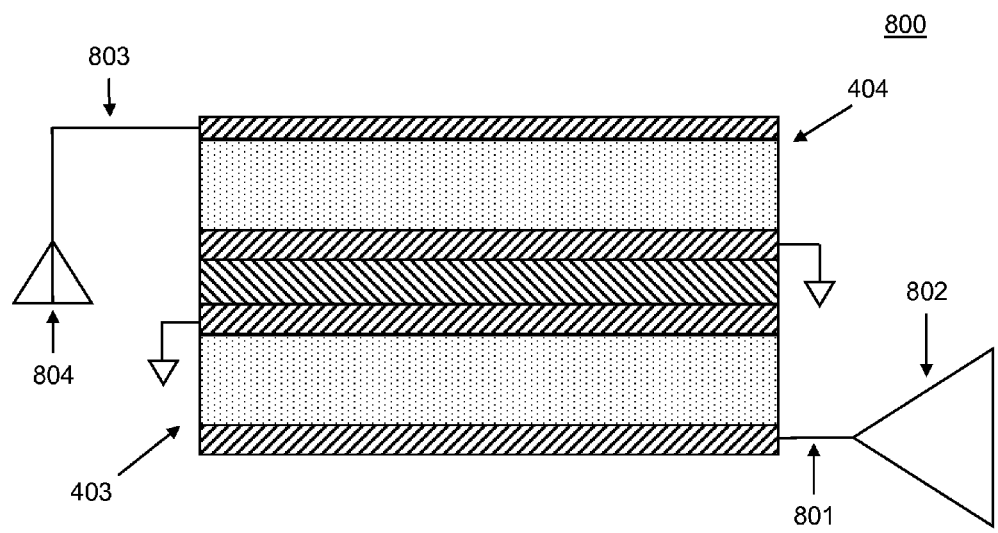
FIG. 8 shows a simplified schematic view of a portion of another embodiment of a signal processing device comprising a second communication device including a coupled acoustic resonator filter which provides an electrical impedance transformation.

FIG. 8 shows a simplified schematic view of a portion of another embodiment of a signal processing device ("device") 800 comprising a second communication device including a coupled acoustic resonator filter which provides an electrical impedance transformation. Again, by "portion" is meant only the elements germane to the present discussion are shown. Naturally, a communication device (e.g., a mobile phone) includes a large number of components, which while necessary to its function, need not be described in order to properly describe the function of device 400 within device 800. Thus, these components are not described to avoid obscuring the description of the illustrative embodiments.

Device 800 includes device 400 including first and second FBAR stacks FBARs 403 and 404. Again, substrate 401 is not illustrated for simplicity. Notably, many details of device 400 described in conjunction with FIG. 4 are common to device 800 and are not repeated. An input 801 is connected to a transmit amplifier 802. Input 801 is connected to first FBAR 403 having a first electrical impedance. An electrical signal from input 801 is converted to an acoustic signal and is coupled to second FBAR 404 having a second electrical impedance. Second FBAR 404 converts the acoustic signal to an electrical signal and provides the electrical signal to an output 803. In the representative embodiment, output 803 is connected to an antenna 804, which transmits the signal to a receiver (not shown in FIG. 8.). In an illustrative embodiment, thicknesses and areal dimensions are selected such that a signal from a 75Ω input 801 is provided to a 50Ω output 803 by device 400 with an appropriate impedance transformation by device 400 to match the output impedance of transmit amplifier 802 on the one hand, and to match the input impedance of antenna 804 on the other hand.

It should be noted that the devices 700 and 800 are merely illustrative embodiments and not intended to limit the scope of the present teachings. Notably, variations of device 400 and connections thereto are contemplated. For instance, the transformation of input to output impedances can be different than the step-up described above. As such, inputs 701 and 801 could be at different impedance (e.g., 100Ω) and the outputs 703 and 803 could be at a different impedance (e.g., 50Ω). Furthermore, device 400 could be used in a wide variety of applications, and thus is not limited to the communications applications described. Generally, device 400 may be used in many types of electronic apparatuses to perform such functions as transforming impedances, linking single-ended circuitry with balanced circuitry or vice versa and providing electrical isolation.

While example embodiments are disclosed herein, one of ordinary skill in the art appreciates that many variations that are in accordance with the present teachings are possible and remain within the scope of the appended claims. The embodiments therefore are not to be restricted except within the scope of the appended claims.

The invention claimed is:

1. A coupled resonator filter, comprising:
a first film bulk acoustic resonator (FBAR), having a first electrical impedance and a first resonance frequency, the first FBAR comprising:
a first electrode,
a first piezoelectric layer having a first thickness, disposed on the first electrode, and
a second electrode disposed on the first piezoelectric layer;
a second FBAR, having a second electrical impedance and a second resonance frequency, and being disposed over the first FBAR, the second FBAR comprising:
a third electrode,
a second piezoelectric layer having a second thickness, disposed on the third electrode, and
a fourth electrode disposed on the second piezoelectric layer; and a
a coupling layer disposed between the first and the second FBARs,
wherein the first thickness of the first piezoelectric layer is substantially the same as the second thickness of the second piezoelectric layer,
wherein the first and second resonance frequencies are substantially different from each other, and
wherein a thickness of the fourth electrode is substantially different than a thickness of at least one of the first, second, and third electrodes.

2. The filter of claim 1, wherein the combined thickness of the third and fourth electrodes is substantially less than a combined thickness of the first and second electrodes.

3. The filter of claim 1, wherein the thickness of the fourth electrode is substantially less than a thickness of at least one of the first, second, and third electrodes.

4. The filter of claim 1, wherein an electrical impedance of the filter between the first and second electrodes is substantially greater than an electrical impedance of the filter between the third and fourth and second electrodes.

5. The filter of claim 1, wherein the first electrical impedance at a passband frequency of the device is greater than the second electrical impedance at the passband frequency of the device.

6. A signal processing device, comprising:
a first acoustic resonator, having a first electrical impedance and a first resonance frequency, the first acoustic resonator comprising:
a first set of electrodes, and
a first piezoelectric layer having a first thickness, disposed between the first set of electrodes;
a second acoustic resonator, having a second electrical impedance and a second resonance frequency, and being disposed over the first acoustic resonator, the second acoustic resonator comprising:
a second set of electrodes, and
a second piezoelectric layer having a second thickness that is substantially the same as the first thickness of the first piezoelectric layer, wherein the second piezoelectric layer is disposed between the second set of electrodes; and a
a coupling layer disposed between the first and the second acoustic resonators,
wherein the first electrical impedance at a passband frequency of the device substantially differs from the second electrical impedance at the passband frequency of the device, and
wherein the first and second resonance frequencies are substantially different from each other.

7. The device of claim 6, wherein at least one of the electrodes of the first set of electrodes has a substantially different thickness than at least one of the electrodes of the second set of electrodes.

8. The device of claim 7, wherein a top electrode of the first set of electrodes has a substantially different thickness than a corresponding top electrode of the second set of electrodes.

9. The device of claim 8, wherein the top electrode of the second set of electrodes is substantially thinner than the corresponding top electrode of the first set of electrodes.

10. The device of claim 7, wherein a top electrode of the second set of electrodes has a substantially different thickness than a bottom electrode of the second set of electrodes.

11. The device of claim 6, wherein an electrical impedance of the device between the first set of electrodes of the first acoustic resonator is substantially greater than an electrical impedance of the device between the second set of electrodes of the second acoustic resonator.

12. The device of claim 6, further comprising:
an amplifier having an output connected to at least a first electrode of one of the first and second sets of electrodes; and
an antenna having an input connected to at least a second electrode of the other one of the first and second sets of electrodes.

13. The device of claim 6, further comprising:
an antenna having an output connected to at least a first electrode of one of the first and second sets of electrodes; and
an amplifier having an input connected to at least a second electrode of the other one of the first and second sets of electrodes.

* * * * *